United States Patent [19]

Sioshansi

[11] Patent Number: 5,154,023
[45] Date of Patent: Oct. 13, 1992

[54] POLISHING PROCESS FOR REFRACTORY MATERIALS

[75] Inventor: Piran Sioshansi, Lincoln, Mass.

[73] Assignee: Spire Corporation, Bedford, Mass.

[21] Appl. No.: 713,763

[22] Filed: Jun. 11, 1991

[51] Int. Cl.$^5$ .............................................. B24B 37/04
[52] U.S. Cl. ...................................... 51/323; 51/326
[58] Field of Search ............... 51/5 R, 281 R, 283 R, 51/326, 327, 319, 320, 318, 323; 156/153

[56] References Cited

U.S. PATENT DOCUMENTS

| | | | |
|---|---|---|---|
| 3,900,636 | 8/1975 | Curry et al. | 427/38 |
| 4,465,524 | 8/1984 | Dearnaley et al. | 148/31.5 |
| 4,568,396 | 2/1986 | Vardimann | 148/133 |
| 4,596,208 | 6/1986 | Wolfson et al. | 118/712 |
| 4,693,760 | 9/1987 | Sioshansi | 148/4 |
| 4,743,308 | 5/1988 | Sioshansi et al. | 148/4 |
| 4,743,493 | 5/1988 | Sioshansi et al. | 428/217 |
| 4,861,407 | 8/1989 | Volkmann | 156/153 |
| 5,032,243 | 7/1991 | Bache | 204/192.34 |

OTHER PUBLICATIONS

E. G. Spencer et al "Ion Machining of Diamond" *J. Appl. Phys.* vol. 43, No. 7 pp. 2956-2958 (1972).
J. C. Angus et al "Diamond Growth at Low Pressures" *MRS Bulletin* pp. 38-47.
C. J. H. Wort et al "Optical and Other Properties of MPACVD Diamond" *Proc. SPIE*, 112 pp. 199-204 (1989).
Peter Taborek "Optical Properties of Microcrystalline CVD Diamond" *Proc. SPIE*, 1112 pp. 205-211 (1989).
I. T. Miyamoto et al "Sharpening Diamond Tools Having an Apex Angle of Less than 60° with a Low Energy Ion Beam", *Nucl. Instr. & Meth. in Phys. Res.* B39 (1989) pp. 696-699.
X. H. Wang et al "Infrared Optical Properties of CVD Diamond Films" *J. Mater. Res.* vol. 5, No. 11, Nov. 1990 pp. 2345-2350.
I. T. Miyamoto et al "Ion Beam Machining of Single-Point Diamond Tools for Nano-Precision Turning" *Nanotechnology* (UK) vol. 1, No. 1 pp. 44-49 Jul. 1990.
I. T. Miyamoto et al "Sharpening Diamond Knives Having a Small Apex Angle of Less Than 55 Degrees with High Energy Argon Ion Beams" *J. Mat. Sci. Lett.* (UK) vol. 7 No. 11 pp. 1175-1177 Nov. 1988.

*Primary Examiner*—Bruce M. Kisliuk
*Assistant Examiner*—Jack W. Lavinder
*Attorney, Agent, or Firm*—Morse, Altman, Dacey & Benson

[57] ABSTRACT

A cost-effective process for polishing refractory materials, including natural and synthetic diamond, sapphire, ruby and $Si_3N_4$ balls, is disclosed, wherein the surfaces thereof are successively softened to a predetermined depth by ion implantation, followed by mechanical polishing. This cycle of ion-implantation softening, followed by mechanical polishing, is repeated until such time that surface profilometry indicates that a desired surface smoothness has been achieved.

10 Claims, 5 Drawing Sheets

A SCHEMATIC REPRESENTATION OF THE PREFERRED POLISHING PROCESS AS SHOWN IN FIGURES 3 - 10

Fig. 9

POLISHING PROCESS FOR REFRACTORY MATERIALS

BACKGROUND OF THE INVENTION

1. Field of the Invention

The present invention relates generally to polishing processes and, more particularly, to a polishing process for refractory materials, such as natural and synthetic (CVD) diamond films, gems of sapphire or ruby, silicon nitride balls and the like.

2. The Prior Art

Refractory materials excel in many desirable properties. These include high hardness, high melting point, being heat resistant and chemically inert, high thermal conductivity, high electrical resistivity, and some of them also possessing optical transparency. These desirable qualities suggest a multitude of uses and applications. Yet the widespread use of these refractory materials has been hampered, inter alia, by, their rarity, their cost and most importantly, difficulty in shaping and treating these materials, in particular, polishing their surfaces to the requirements of optical applications.

Potential uses and applications of such refractory materials include bearing and wear resistant surfaces, heat sinks, optical castings, optical windows, and also as active electronic device elements. As early as 1955, some workers heralded a process for synthetic diamond at relatively high pressures where diamond is thermodynamically stable. See F. P. Bundy et al, *Nature* 176 (1955), p. 51. A more cost-effective process for producing synthetic diamond at low pressure has occurred with the development of chemical vapor deposition (CVD). See J. C. Angus et al, "Diamond Growth At Low Pressures," *MRS Bulletin*, pp. 38-47, Oct. 1989. The CVD process for producing thin synthetic CVD diamond films inexpensively and en masse has revolutionized the diamond industry. The CVD diamond films are pure but are polyhigh polycrystalline, hence optically rough, possessin an extremely high absorption coefficient of about 150 cm$^{-1}$ due to scattering at the rough surfaces. Scattering from these rough surfaces in turn results in a low transmittance, especially in the visible and the infrared (IR) regions. Consequently, the optical rough surfaces of CVD diamond films inhibit their use as a lens coating material for IR or X-ray optical windows. See X. H. Wang et al, "Infrared Optical Properties of CVD Diamond Films," *J. Mater. Res.*, Vol. 5, No. 11, Nov. 1990. Some workers in the field have attempted to remedy the optical roughness of CVD diamond films by lowering the deposition pressure or increasing the CH$_4$ concentrations in an effort to reduce the size of the deposited diamond crystal grains. See C. J. H. Wost et al., "Optical and Other Properties of MPACVD Diamond," *Proc. SPIE*, 1112, pp. 199-204 (1989). Such remedies run the risk of altering the chemical composition of the resultant CVD diamond films and/or changing certain of their physical properties.

The only other known way of reducing scatter is to polish the CVD deposited diamond films. Since however, diamond is the hardest substance known, meriting a 10 on the Mohs scale and also is chemically inert, its surface polishing is no mean task. As has been reported, CVD diamond films have been polished, with the films deposited on silicon using a cast iron lap and various mesh sizes of natural diamond polishing compounds. After many hours of polishing, a reasonable surface finish has been achieved, with optical transmission approaching that of single crystal diamond. However, the reporter in his conclusion states that further improvements in the CVD diamond surface finish are required to make quantitive measurements of the bulk optical absorption of such CVD diamond films. See Peter Taborek, "Optical Properties of Microcrystalline CVD Diamond," *Proc. SPIE*, 1112, pp. 205-211 (1989). Another polishing process which has been reported took six weeks of polishing CVD diamond films. Therein, the rough surface of the diamond film is rubbed against a cast-iron block heated to about 350° C. After six weeks of polishing, the surface was very smooth indeed. Ion beam machining of diamond tools and knives also have surfaced in the literature. See I. T. Miyamoto et al, "Ion Beam Machining of Single-Point Diamond Tools for Nano-Precision Turning," *Nanotechnology*, Vol. 1, No. 1, pp. 44-49, Tokyo (1990); I. K. Miyamoto et al., "Sharpening Diamond Knives Having a Small Apex Angle of Less than 55 Degrees with High-Energy Argon Ion Beams," *J. Mater. Sci. Lett.*, Vol. 7, No. 11, pp. 1175-1177, London (1988); and E. G. Spencer et al., "Ion Machining of Diamond," *J. Appl. Phys.*, Vol. 43, No. 7, pp. 2956-2958 (1972). As far as known however, there are now no polishing processes reported that reliably and economically produce an optically required smooth surface on CVD produced diamond films.

SUMMARY OF THE INVENTION

It is a principal object of the present invention to overcome the above disadvantages by providing an improved, reliable, reproducible and cost-effective process for polishing refractory materials, such as CVD diamond films, sapphire and ruby items and materials and Si$_3$N$_4$ balls to their respective required smoothnesses.

More specifically, it is an object of the present invention to provide a process for polishing refractory materials, including CVD diamond films, sapphire and ruby items and materials, and Si$_3$N$_4$ balls comprising providing a refractory material having an operative surface, softening the operative surface to a predetermined depth by forming a soft ion-implanted layer therein, subjecting the softened ion-implanted layer to mechanical polishing, and repeating the softening and polishing steps until the desired surface smoothness of the operative surface has been achieved. The resultant polished refractory materials find uses as optical coatings and optical windows, polished gems, heat sinks, bearing and wear resistant surfaces and as active electronic device elements. The softening of the operative surface of the refractory material by the formation therein of the soft ion-implanted layer is effected by ion implantation which affects the crystal lattice structure of the layer so as to transform the same to a quasi-amorphous state. This transformation to a quasi-amorphous state serves to condition the operative surface of the refractory material to mechanical abrasion during its subsequent polishing.

Other objects of the present invention will in part be obvious and will in part appear hereinafter.

The invention accordingly comprises the process of the present disclosure, its steps, components, parts and their interrelationship, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein:

FIGS. 3–10 illustrate the individual steps of the preferred polishing process of FIG. 2;

DETAILED DESCRIPTION OF THE PREFERRED EMBODIMENTS

Figure 1:
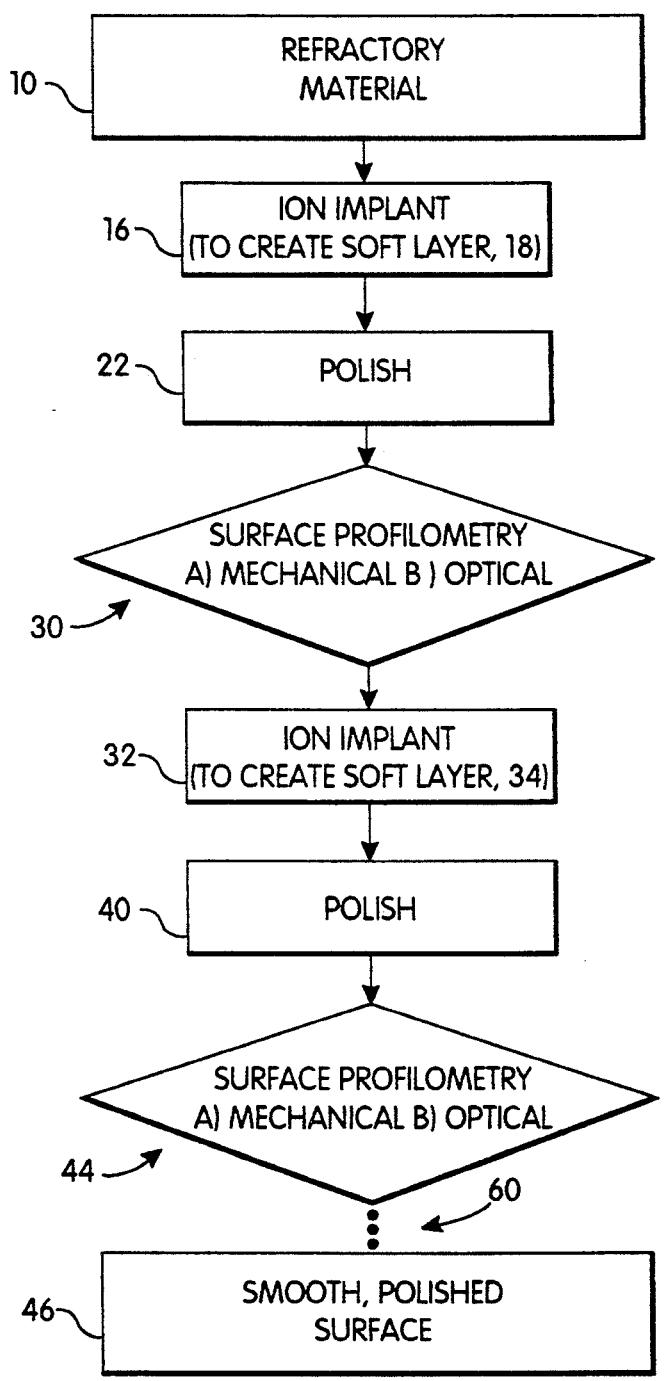
FIG. 1 is a flow chart of a preferred polishing process for refractory materials according to the invention.

In general, the present invention pertains to an improved, reliable, reproducible and cost-effective process for polishing refractory materials, such as natural and synthetic (CVD) diamond films, zirconium oxide (zirconia), sapphire and ruby products and materials and Si$_3$N$_4$ balls to a surface smoothness required to render them useful for their respective applications. Some of such applications include their use as polished gems, bearing and wear resistant surfaces, tool coatings, heat sinks, optical coatings, optical windows and substrates for active electronic device elements.

While the subsequent description of the preferred process of polishing refractory materials according to the invention concentrates primarily on synthetic diamond, it is understood that the inventive process is equally applicable to other hard materials resistant to treatment, such as by polishing. The term "refractory material" as used in this specification and in the appended claims is intended to define materials that are resistant to treatment or cure, that are difficult to fuse, corrode or draw out, that are capable of enduring high temperatures without adverse affects, that possess a high melting point and high hardness of at least about 8 when measured on the Mohs scale, with diamond being the hardest substance known, having a hardness of 10 on the Mohs scale. In addition to synthetic diamond film, the refractory materials specifically include natural diamond, ruby and sapphire products, Zirconia gem, silicon nitride (Si$_3$N$_4$) balls, such as miniature balls useful in ball bearings for space applications, and the like.

As mentioned, the development of chemical vapor deposition (CVD) processes, in their respective variations, to grow relatively inexpensive synthetic diamond films on inexpensive substrates has indeed revolutionized the diamond industry. Spire Corporation, the assignee herein, has been a prominent developer and practitioner of CVD processes and has been granted several patents in this field. See, for example, U.S. Pat. No. 4,596,208 that issued to Robert G. Wolfson et al on Jun. 24, 1986, titled "CVD Reaction Chamber." Also as mentioned, CVD produced diamond films possess unique optical, electrical, thermal and mechanical properties that make diamond the material of choice for many applications. For instance, the optical transparency in the infrared-visible-ultraviolet (225 nm) regions and the low atomic mass, combined with the excellent mechanical properties, make diamond a promising lens coating material for IR or x-ray windows. Unfortunately, the growth surfaces of almost all CVD diamond films are optically rough. Scattering from these rough surfaces results in a low transmittance which is defined as belonging to the direct incident beam, especially in the visible and infrared regions. The absorption coefficient was found to be extremely high (20–212 cm$^{-1}$) primarily due to losses caused by scattering at the rough surfaces.

As mentioned above, some workers in the field have attempted to remedy the optical roughness of CVD diamond films by lowering the deposition pressure or increasing the CH$_4$ concentration in an effort to reduce the size of the deposited diamond crystal grains. See C. J. H. Wost et al., id. Such remedies, however, run the risk of altering the chemical composition of the resultant CVD diamond films and/or changing certain of their physical properties. That leaves polishing as the only other known way of reducing scatter in CVD deposited diamond films. Some polishing techniques are effective but require many hours of polishing to produce a reasonable finish. See Peter Taborek, id. Still another polishing process took six weeks of polishing CVD diamond films before a satisfactory surface smoothness was achieved. See E. Bruton, *Diamonds*, N.A.G. Press Ltd., London (1978) p. 335.

The inventive process herein has been developed to fill this need for reliably, reproducibly and economically to produce an optically acceptable smooth surface in refractory materials, such as for example, CVD produced diamond films.

Figure 2:
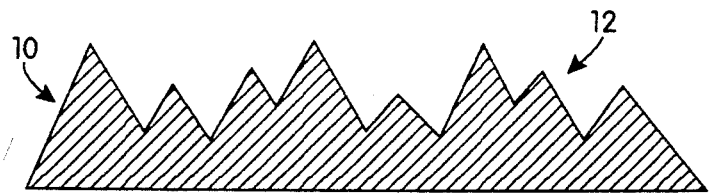
FIG. 2 is a schematic representation of the preferred polishing process of FIG. 1.
Figure 3:
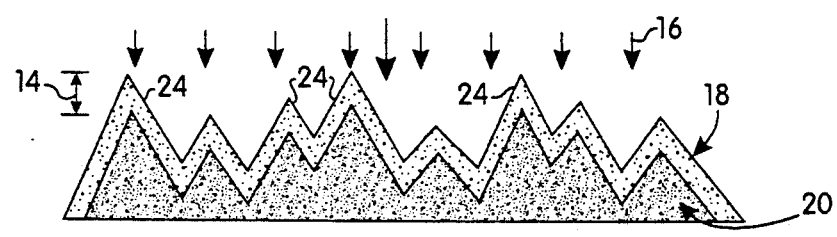
Figure 4:
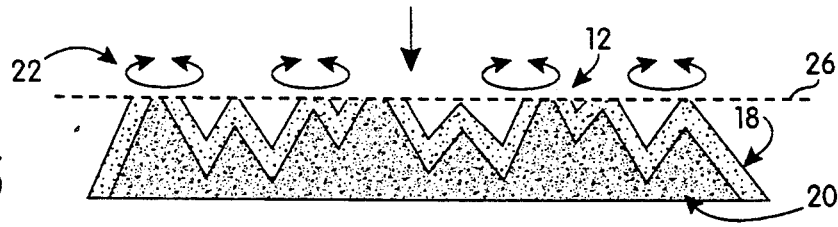

FIG. 1 is a flow chart of a preferred polishing process for refractory materials according to the invention. FIG. 2 is a schematic representation of the preferred polishing process according to FIG. 1. FIGS. 3–10 illustrate the individual steps of the preferred polishing process of FIG. 2. And FIGS. 11–13 graphically contrast and illustrate the softening effect of the inventive process on the surface of a diamond sample.

A refractory material 10 is provided. The refractory material 10, as illustrated on an enlarged scale in FIG. 3, has an operative surface 12, which is optically rough. This rough operative surface 12 first is softened to a predetermined depth, as indicated by an arrow 14 in FIG. 4, by ion implantation 16, so as to create a soft, ion-implanted layer 18 on the refractory substrate 30.

As mentioned, the refractory material 10 can comprise a natural or synthetic diamond film, a zirconium gem, a sapphire or ruby item, a silicon nitride (Si$_3$N$_4$) ball or the like. The ion-implantation 16 step can be carried out in any suitable ion implanter, preferably one with an energy range to 5000 KeV, such as a Varian-Extrion implanter, an Eaton-Nova implanter, or the implanter illustrated in and described with reference to a prior patent of the within applicant, to wit, U.S. Pat. No. 4,793,760, granted to Piran Sioshansi on Sep. 15, 1987, entitled "Ion Implantation of Titanium Workpieces Without Surface Discoloration," and assigned to the common assignee herein, Spire Corporation of Bedford, Mass. Two other patents, one involving the ion implantation of plastics and the other the corrosion inhibition of metal alloys, also have been granted to Sioshansi et al., on May 10, 1988 and assigned to the common assignee, the said Spire Corporation of Bedford, Mass., to wit, U.S. Pat. Nos. 4,743,493 and 4,743,308, respectively. Others also employed ion implantation of material surfaces for various purposes, as for example Curry et al., U.S. Pat. No. 3,900,636 to improve the hardness of cutting edges, to improve the adhesion of metallic and non-metallic coatings on cutting edges, and to improve the corrosion resistance of the cutting edge material. Dearnaley et al. disclose a process for improving the wear resistance of titanium and its alloys by coating their surfaces with a metal layer through ion implantation, see U.S. Pat. No. 4,465,524. And Ronald G. Vardiman also discloses a method of making titanium alloy more resistant to sliding wear and fretting fatigue by implanting carbon ions into the surface thereof, see U.S. Pat. No. 4,568,396.

All of the above patents employ ion bombardment or ion implantation to strengthen and/or to harden the surfaces of the respective materials. In contrast, the inventive process employs ion implantation and/or ion bombardment to soften a surface layer of refractory materials 10, such as CVD diamond films and the like, as above enumerated. When ion implanting the optically rough polycrystalline surface 12 of the refractory material 10, the ion implanted layer 18 thereof, to the predetermined depth 14, becomes softened by the ion-implantation by affecting the orientation of the crystal lattice structure of the refractory material 10.

As known, diamond is the prototypical example of the diamond cubic-crystal structure, formed of two interpenetrating face-centered cubic lattices of atoms displaced one quarter of the cube diagonal from each other. In diamond, each carbon atom is tetrahedrally coordinated to four other carbon atoms through o-bonds arising from $Sp^3$ hybrid atomic orbitals. The lattice may be visualized as stacked layers of six-membered rings, with each ring in a "chair" conformation. The structure in which all rings are "chairs" is the diamond cubic lattice.

When the ion implanted layer 18 has been softened by the ion implantation 16 affecting the orientation of its crystal lattice structure, the result is a transformation of this structure to quasi-amorphous state in which the heretofore solid cubic lattice structure and its attendant physical properties of hardness no longer prevail, at least not to the extent as before the ion implantation 16. Consequently, the ion-implanted layer 18, to its predetermined depth 14, has been softened and thus conditioned for the next operative step of mechanical polishing 22.

Figure 11:
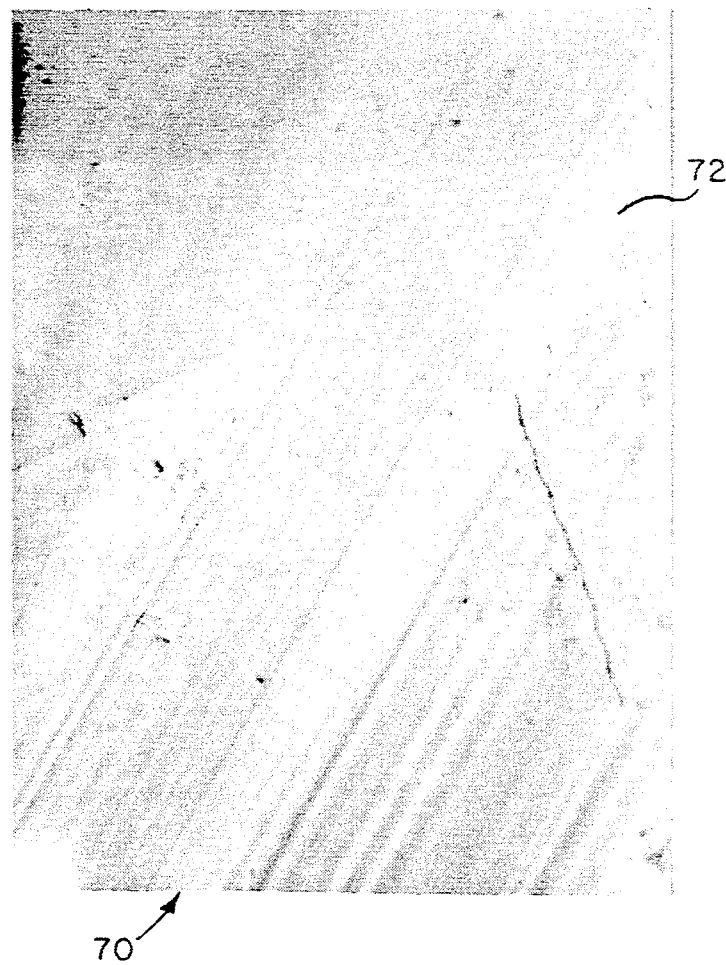
FIGS. 11 is an optical microscope photograph at 100× magnification of a surface of an untreated diamond sample, 3 mm$^2$ and 1 mm thick.
Figure 12:
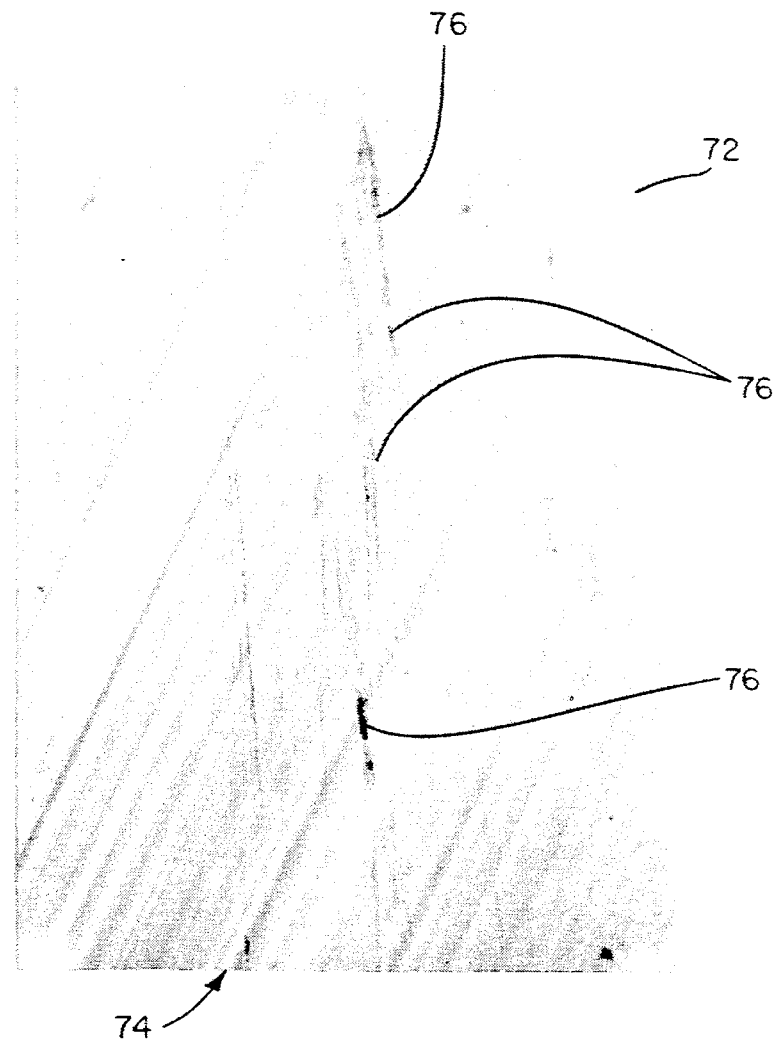
FIG. 12 is a second optical microscope photograph of the same untreated surface shown in FIG. 11 after the same has been repeatedly scratched by a diamond scribe.
Figure 13:
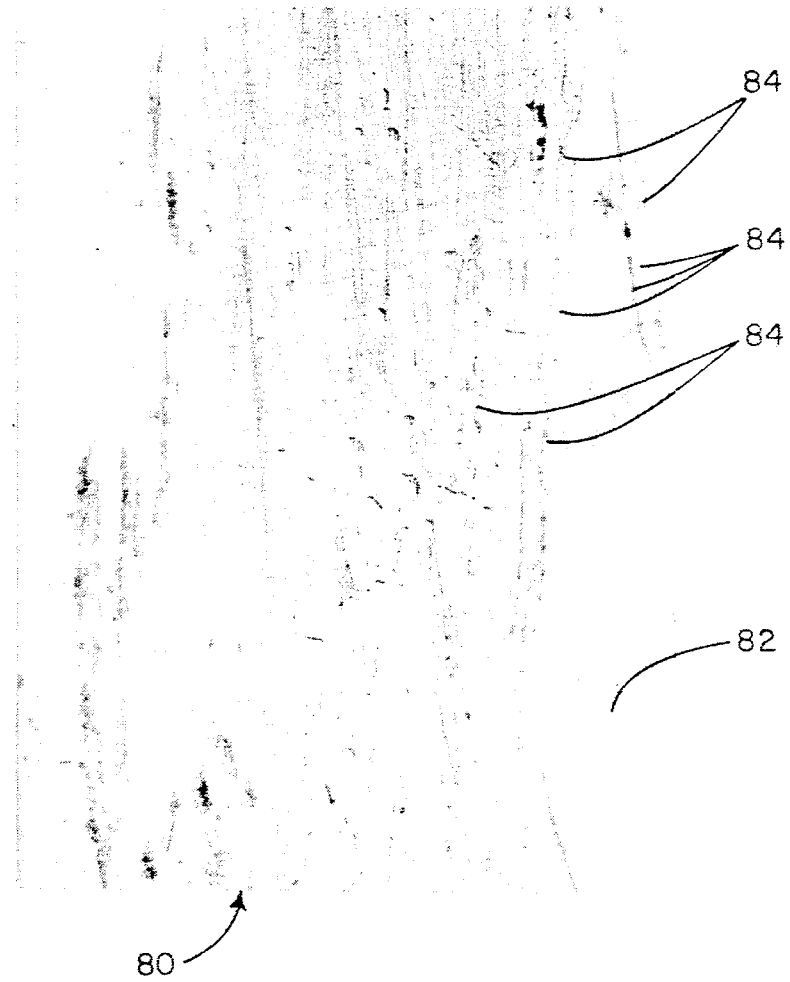
FIG. 13 is an optical microscope photograph at 100× magnification of a surface of another diamond sample, 3 mm$^2$ and 1 mm thick, which surface first has been treated according to the invention, i.e., softened by forming therein a soft ion-implanted layer, and then the softened surface layer thereof has been repeatedly scratched by a diamond scribe.

As mentioned, FIGS. 11–13 graphically contrast and illustrate the softening effect achieved by the inventive process on the surface of a diamond sample.

In FIG. 11, there is shown a photograph 70 of a surface 72 of an untreated diamond sample 3 $mm^2$ and 1 mm thick. The photograph 70 was taken under an optical microscope at 100× magnification. In FIG. 12, a second photograph 74 of the same untreated surface 72 is shown after the surface 72 has been repeatedly scratched, as at 76, by a diamond scribe.

In FIG. 13, there is shown a third photograph 80 of a surface 82 of a diamond sample, 3 $mm^2$ and 1 mm thick. The surface 82 first has been treated according to the invention, that is the surface 82 has been softened by forming therein a soft ion-implanted layer by hardening the surface 82 with nitrogen ions at 80 KeV, with a dose of 8E17 ions/$cm^2$. The thus softened surface 82 then also has been repeatedly scratched, as at 84, by a diamond scribe with approximately the same number of passes (from about 20 to about 25) and applying about the same force.

A juxtaposition of FIGS. 12 and 13 clearly demonstrates the softening effect provided by the inventive process to the treated diamond surface 82 as opposed to the untreated surface 72.

The ion-implantation 16 is effected by bombarding the operative surface 12 of the refractory material 10 with at least one of the following ions: nitrogen, oxygen, carbon, boron, any of the inert gases (He, Ne, Ar, Kr, Xe) aluminum, magnesium, silicon, titanium, yttrium, nickel, flourine and chlorine ions. The ion-implantation 16 preferably is effected with the following operational parameters: a time duration from a few seconds to about one hour; a dose ranging from about 1E14 to about 1E18; an energy level from about 10 KeV to about 5000 KeV; and a current density from about 0.1 uA/$cm^2$ to about 10 uA/$cm^2$.

The ion-implantation 16 operational parameters will vary with the nature of the refractory material 10, with the CVD diamond films requiring more energy and current density than, for example, the silicon nitride balls. Further, an optically very rough operative surface 12 will require more energy than a smoother operative surface 12 to start with. Further, since the invention process includes iteration, as more fully evident below, the energy levels will be high for the first iteration and will be progressively reduced with each successive iteration, as the operative surface 12 gets smoother.

The mechanical polishing 22 step is effected by using one of a number of known polishing methods, such as using a cast iron lap and employing mesh sizes of 0.01 to about 10 micrometers of one or more of the following abrasive compounds: natural diamond, corundum, SiC, $Al_2O_3$, ZrO, MgO, $Cr_2O_3$, $Fe_2O_3$. Because of the preconditioning of the operative surface 12 of the refractory material 10 by ion implantation and thus forming the softened quasi-amorphous ion-implantation layer 18 therein, the ease and the speed of the mechanical polishing is much improved over existing techniques. Rather than polishing for weeks or even many hours, this first mechanical polishing 22 step preferably lasts from about one to about sixty minutes until at least the peaks 24 have been successfully removed to about the level represented by a horizontal dashed line 26, observe FIG. 5. Since less tangential force is required for the polishing step 22 then with conventional polishing, dislodging of polycrystalline grains from the operative surface 12 is markedly reduced, if not altogether prevented. Also, a wider selection of abrasive particles, as above enumerated, can be employed in the polishing step 22 than heretofore considered advisable.

Preferably, the mechanical polishing step 22 is stopped automatically at its predetermined end-of-range. For the less hard refractory materials, such as $Si_3N_4$ balls, one or two iterations may suffice to produce an acceptably smooth surface. Thus, the polishing step 22 preferably is followed by surface profilometry 30, which can be mechanical and/or optical.

For most refractory materials 10, a single iteration of the dual steps of softening the operative surface 12 by ion implantation 16, followed by mechanical polishing 22, is not sufficient to achieve an optically acceptable smooth surface. Thus, these dual steps 16 and 22 have to be repeated a number of times, depending on the refractory material 10 and its respective characteristics, such as its surface roughness, its exact composition and its crystalline orientation. For CVD diamond films, the hardest material, about five or six iterations are needed to achieve a superior optical quality surface. For other refractory materials 10, about three to five iterations suffice.

Figure 5:
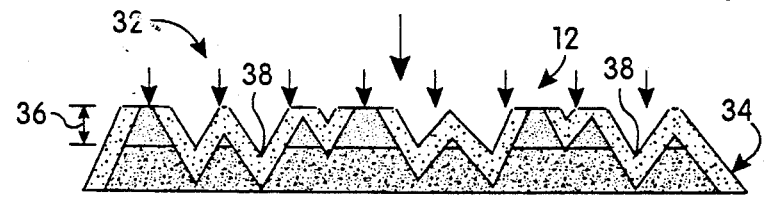
Figure 6:
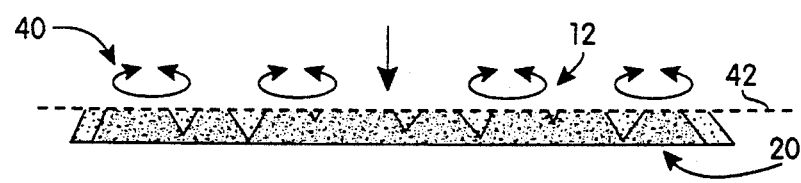

As will be observed in FIG. 5, the first mechanical polishing 22 has removed most of the peaks 24 in the soft, ion-implanted layer 18, as indicated by the dashed line 26. Since the operative surface 12 still is unacceptably rough, as measured by surface profilometry 30, a repeat of the softening and polishing steps is required.

Figure 7:
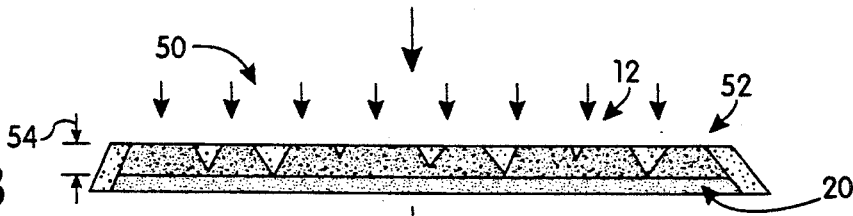

A second ion-implantation 32 of the operative surface 12 is effected, in like fashion as with the first ion implantation 16. The second ion-implantation 32 further softens the operative surface 12 by forming a further soft ion-implanted layer 34 therein to a further predetermined depth, as indicated by an arrow 36, observe FIG. 6. It will be noted that this second softened ion-implanted layer 34 now also reaches the valleys 38 in the operative surface 12. A second mechanical polishing 40, as illustrated in FIG. 7, now succeeds in polishing off most, if not the entire depth of this second softened, ion-implanted layer 34, as indictated by a second horizontal dashed line 42. With an automatic end-of-range polish, the polishing operation is stopped automatically after the softened ion-implanted layer 34 is polished away during each intermediate polishing step. Each polishing step preferably is followed by an automatic surface profilometry operation, as a second one 44 herein, observe FIG. 1, to determine whether an optically acceptable smooth, polished surface 46 has been already achieved in the operative surface 12 of the refractory material 10. If so, further iteration of softening and polishing is dispensed with.

Figure 8:
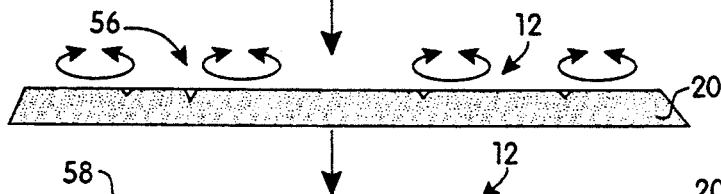
Figure 10:
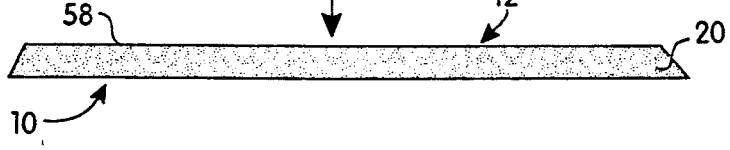

If the second profilometry operation 44 indicates a still unsatisfactory operative surface 12, a still further ion-implantation 50 step is directed at the operative surface 12, observe FIG. 8. This third ion-implantation 50 further softens the operative surface 12 by forming a third soft ion-implanted layer 52 therein to a further predetermined depth, as indicated by arrow 54, which now effectively encompasses the previous valleys 38 and more, note FIG. 6. This third softened layer 52 is again mechanically polished away, as at 56, in FIG. 9. A subsequent surface profilometry measurement, not shown, now indicates an optically acceptable, smooth, polished surface 58 in the operative surface of the refractory material 10. In FIG. 1, a dotted line 60 serves to indicate such a plurality of such further iterations of the dual softening and polishing operations as may be required to achieve an optically smooth surface.

EXAMPLE I

A CVD diamond film, intended for use as an optical window on a spacecraft, was polished according to the invention, with the following operational parameters:

| | |
|---|---|
| Number of iterations: | 5 |
| Energy of ion implantation: | first iteration - 3,000 keV |
| | second iteration - 2,000 keV |
| | third iteration - 1,000 keV |
| | fourth iteration - 500 keV |
| | fifth iteration - 100 keV |
| Gas ion used: | Nitrogen |
| Dose: | 1E17 |

-continued

| | |
|---|---|
| Current density: | 1.0 microamps/cm$^2$ |
| Time duration of each polishing process: | about 60 minutes |
| Polishing medium: | diamond |

EXAMPLE II

A sapphire flat product, polished according to the invention, with the following operational parameters:

| | |
|---|---|
| Number of iterations: | 3 |
| Energy of ion implantation: | first iteration - 2000 keV |
| | second iteration - 800 keV |
| | third iteration - 200 keV |
| Gas ion used: | Nitrogen |
| Dose: | 5E16 |
| Current density: | 1.0 uA/cm$^2$ |
| Time duration of polishing process: | about 30 minutes |
| Polishing medium: | diamond |

EXAMPLE III

A silicon nitride product, was polished according to the invention, with the following operational parameters:

| | | |
|---|---|---|
| Number of iterations: 3 | | |
| Energy of ion implantation: | first iteration - | 2000 keV |
| | second iteration - | 800 keV |
| | third iteration - | 200 keV |
| Gas ion used: Nitrogen | | |
| Dose: 1E17 | | |
| Current density: 1.0 uA/cm$^2$ | | |
| Time duration of polishing process: about 30 minutes | | |
| Polishing medium: diamond | | |

Thus it has been shown and described an improved cost-effective process developed for polishing refractory materials 10, which process satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A process of polishing refractory materials comprising:
   (a) providing a refractory material having an operative surface;
   (b) softening said operative surface to a predetermined depth by forming a soft ion-implanted layer in said surface;
   (c) polishing said softened layer of said operative surface; and
   (d) repeating said softening and polishing steps until a desired surface smoothness of said operative surface is achieved.

2. The process of claim 1 wherein said refractory material is one of a group consisting of: natural diamond, synthetic diamond, sapphire, ruby, silicon nitride, SiC, polycrystalline alumina and zirconia.

3. The process of claim 1 wherein said refractory material is intended for use as polished gems, optical coatings and optical windows, heat sinks, bearing and low friction wear resistant surfaces and as substrates for active electronic device elements.

4. The process of claim 1 wherein said softening said operative surface by forming said soft ion-implanted layer herein is effected by ion-implantation affecting the crystal lattice structure of said operative surface of said refractory material to said predetermined depth.

5. The process of claim 4 wherein said affecting the crystal lattice structure by said implantation results in a transformation of said crystal lattice structure to a quasi-amorphous state of said refractory material to said predetermined depth.

6. The process of claim 5 wherein said transformation to said quasi-amorphous state of said refractory material conditions its said operative surface for said polishing step.

7. The process of claim 4 wherein said ion-implantation is effected by bombarding said operative surface with at least one of the following ions: nitrogen, oxygen, carbon, boron, all rare gases (He, Ne, Ar, Kr, Xe), aluminum, magnesium, silicon, titanium, yttrium, nickel, flourine and chlorine ions.

8. The process of claim 7 wherein said ion bombardment is effected with the following operational parameters: a time duration of about 30 to about 60 minutes, a dose of ions from about 1E14 to about 1E18, with energy ranging from about 10 to about 5000 keV, and a current density from about 0.1 uA/cm$^2$ to about 10 uA/cm$^2$.

9. The process of claim 1 wherein said polishing said softened layer of said operative surface is effected using a cast iron lap and mesh sizes from about 0.01 to about 10 micrometers of one of the following abrasive compounds: natural diamond, corundum, SiC, Al$_2$O$_3$, ZrO, MgO, Cr$_2$O$_3$ and Fe$_2$O$_3$.

10. The process of claim 1 wherein said softening and polishing steps are repeated at least once.

* * * * *